US009218285B2

(12) United States Patent
Udipi et al.

(10) Patent No.: US 9,218,285 B2
(45) Date of Patent: Dec. 22, 2015

(54) VARIABLE MAPPING OF MEMORY ACCESSES TO REGIONS WITHIN A MEMORY

(71) Applicant: ARM LIMITED, Cambridge (GB)

(72) Inventors: Anirruddha Nagendran Udipi, Austin, TX (US); Ali Saidi, Austin, TX (US); Andreas Hansson, Cambridge (GB); Christopher Emmons, Austin, TX (US)

(73) Assignee: ARM Limited, Cambridge (GB)

( * ) Notice: Subject to any disclaimer, the term of this patent is extended or adjusted under 35 U.S.C. 154(b) by 350 days.

(21) Appl. No.: 13/684,700

(22) Filed: Nov. 26, 2012

(65) Prior Publication Data

US 2014/0149653 A1 May 29, 2014

(51) Int. Cl.
G06F 12/00 (2006.01)
G06F 12/02 (2006.01)
G06F 12/06 (2006.01)
G06F 12/08 (2006.01)
G11C 7/04 (2006.01)
G11C 11/406 (2006.01)
G11C 11/408 (2006.01)

(52) U.S. Cl.
CPC ........ *G06F 12/0292* (2013.01); *G06F 12/0238* (2013.01); *G06F 12/06* (2013.01); *G06F 12/0646* (2013.01); *G06F 12/08* (2013.01); *G11C 7/04* (2013.01); *G11C 11/40622* (2013.01); *G11C 11/40626* (2013.01); *G11C 11/408* (2013.01)

(58) Field of Classification Search
None
See application file for complete search history.

(56) References Cited

U.S. PATENT DOCUMENTS

2004/0068604 A1* 4/2004 Le et al. ............................ 711/5
2011/0252180 A1* 10/2011 Hendry et al. .................... 711/3

OTHER PUBLICATIONS

Liu et al., "RAIDR: Retention-Aware Intelligent DRAM Refresh", *Carnegie Mellon University*, No Date, pp. 1-12.
Pyo et al., "45nm Low-Power Embedded Pseudo-SRAM with ECC-based Auto-Adjusted Self-Refresh Scheme", *IEEE*, 2009, pp. 2517-2520.
Zhang et al., "Exploring Phase Change Memory and 3D Die-Stacking for Power/Thermal Friendly, Fast and Durable Memory Architectures", *18th International Conf. on Parallel Architecture and Compilation Techniques*, 2009, 12 pgs.
Zhang et al., "A Permutation-based Page Interleaving Scheme to Reduce Row-buffer Conflicts and Exploit Data Locality", *IEEE*, 2000, pgs. 1-10.
Yoon et al., "A Row Buffer Locality-Aware Caching Policy for Hybrid Memories", *Carnegie Mellon University*, No Date, 22 pgs.

(Continued)

*Primary Examiner* — Midys Rojas
(74) *Attorney, Agent, or Firm* — Pramudji Law Group PLLC; Ari Pramudji (57) ABSTRACT

An apparatus for processing data 2 includes a memory 4 having a plurality of memory regions 28 to 38. A mapping controller 56 applies a variable mapping to map memory addresses of access requests to different regions within the memory 4. The mapping controller varies the mapping applied in dependence upon both one or more memory behavioral parameters indicative of behavioral characteristics of the different regions and one or more access behavioral parameters indicative of behavioral characteristics of an access request to be mapped. The memory behavioral parameters may include the temperature of the regions and/or the refresh period of the regions. The access behavior able parameters may include the quality of service level, the access frequency, the access volume and/or the identity of the source of the access request.

40 Claims, 4 Drawing Sheets (56) References Cited

OTHER PUBLICATIONS

Venkatesan et al., "Retention-Aware Placement in DRAM (RAPID): Software Methods for Quasi-Non-Volatile DRAM", *IEEE*, 2006, pp. 257-267.

Dong et al., "Simple but Effective Heterogeneous Main Memory with on-chip Memory Controller Support", *SC10*, 2010, 11 pgs.

Qureshi et al., "Scalable High Performance Main Memory System Using Phase-Change Memory Technology", *ISCA'09*, Jun. 2009, pp. 24-33.

Ohsawa et al., ":Optimizing the DRAM Refresh Count for Merged DRAM/Logic LSIs", *ISLPED98*, 1998, pp. 82-87.

Shao et al., "The Bit-reversal SDRAM Address Mapping", *SCOPES'05*, 2005, pp. 62-71.

Carter et al., "Impulse: Building a Smarter Memory Controller", *Intel Corporation*, No Date, 10 pgs.

Kim et al., "Block Based Multi-Period Refresh for Energy Efficient Dynamic Memory", *IEEE*, 2001, pp. 193-197.

Ramos et al., "Page Placement in Hybrid Memory Systems", *ICS'11*, May 2011, 11 pgs.

Jiang et al., "CHOP: Adaptive Filter-Based DRAM Caching for CMP Server Platforms", No Date, 12 pgs.

Mogul et al., "Operating System Support for NVM+DRAM Hybrid Main Memory", *HP Labs*, No Date, 5 pgs.

Dhiman et al., "PDRAM: A Hybrid PRAM and DRAM Main Memory System", *Univ. of California*, No Date, 6 pgs.

Ahn et al., "Adaptive Self Refresh Scheme for Battery Operated High-Density Mobile DRAM Applications", *IEEE*, 2006, pp. 319-322.

* cited by examiner

VARIABLE MAPPING OF MEMORY ACCESSES TO REGIONS WITHIN A MEMORY

BACKGROUND OF THE INVENTION

1. Field of the Invention

This invention relates to the field of data processing systems. More particularly, this invention relates to how addresses of memory accesses are mapped to different regions of a memory.

2. Description of the Prior Art

It is known to provide data processing systems including a memory system. Such a memory system may have a plurality of different levels arranged in a hierarchy. As an example, a memory system may include a cache memory and a main memory. Within a single level within such a hierarchy there may be provided multiple different regions. As an example, a main memory may be split into a plurality of banks of bit cells. Each bank of bit cells may share the bit lines running therethrough. The bit lines are connected to a row of sense amplifiers supplying a buffer memory which may store one row of bit values at a time.

As process geometries fall in size, it becomes difficult to provide memories which have uniform properties in the multiple regions which may form such memories. The variations which arise may be the result of manufacturing variation, operating temperature or other reasons. Furthermore, the variations may change with time as different operating parameters change and also as the circuit ages. Variations may also arise independently of manufacturing differences, e.g. temperature differences.

One way of dealing with such variations within the behavioral characteristics of a memory is to operate the memory such that it assumes the worst case behavioral characteristics and yet still operates correctly. Whilst such an approach is safe, it reduces the maximum performance attainable in terms, for example, of speed, capacity, energy efficiency, mean time before failure etc.

SUMMARY OF THE INVENTION

Viewed from one aspect the present invention provides an apparatus for processing data comprising:

a memory having a plurality of memory regions at a common level within a memory system;

at least one memory access request source configured to generate an access request to a memory address within said memory; and a mapping controller configured to apply a variable mapping to map said memory address to one of said plurality of regions;

wherein said mapping controller varies said mapping in dependence upon both:

(i) memory behavioral parameters indicative of one or more behavioral characteristics of different ones of said plurality of regions; and (ii) one or more access behavioral parameters indicative of behavioral characteristics of said access request.

The present technique recognizes that it is possible to map a given memory access (both reads and writes) to a memory address within the memory in different ways (reads will go to where the data was previously mapped when written). Furthermore, the variation in this mapping may be made dependent upon both memory behavioral parameters indicative of one or more memory behavioral parameters of the different regions of the memory as well as one or more access behavioral parameters indicative of behavioral characteristics of the access request being mapped. Providing a mapping which varies upon both the memory characteristics and the access characteristics permits the access characteristics to be matched to the memory characteristics and thereby achieve, for example, a more efficient/desirable usage of the memory.

The memory behavioral characteristics are ones in which the behavior of the memory varies between the different regions. The behavior of the memory corresponds to its characteristics arising in use rather than characteristics dependent upon static factors such as the layout of the memory, which is fixed in advance and would not change between different instances of a given memory design.

The one or more behavior characteristics may be dynamic behavioral characteristics that change with time. Examples of such dynamic behavioral characteristics include the current operating temperature of a region, the current volume of data being stored within a region, etc. Other forms of behavioral characteristics may be ones which vary in dependence upon manufacturing variability of the memory. Examples of such manufacturing variability would be, in the case of a dynamic memory, the maximum effective refresh period for the dynamic memory, another example in a different form of memory may be the minimum effective write time required for cells within a particular region of the memory. It will be appreciated that many further forms of behavioral characteristics of a memory may also be used to influence the mapping between memory addresses and regions of the memory. The present technique encompasses these different alternatives.

In some embodiments measurement circuitry may be included to measure one or more behavioral characteristics of different ones of the regions of the memory. Building in such measurement circuitry to the system permits, if desired, ongoing measurement during use to be performed or, in other embodiments, a convenient way to perform measurement and calibration when the memory is first used.

As previously mentioned, in some embodiments the behavioral parameters of the different regions that are used to influence the mapping may include temperatures of respective different ones of the regions.

The temperature of the different regions may be measured, inferred or otherwise determined in a variety of different ways.

In some embodiments the memory may include a plurality of temperature sensors configured to measure the temperature of different ones of the plurality of regions. It may be possible to provide one or more temperature sensors dedicated to each region of the memory. In other embodiments this may not be possible and it may instead be necessary to interpolate between temperatures measured at different points within the memory to estimate temperatures of different regions. As an example, a given region may be found midway between two temperature sensors and an average (or other statistical measure) of the temperatures measured at those two temperature sensors may be interpolated as the temperature of that given region.

In other embodiments temperature estimating circuitry may be provided to estimate the temperature of the different regions in response to detected activity involving those regions. In some embodiments the temperature may be estimated in response to a detected volume of data accesses to the respective different regions. Generally speaking, accesses involving a greater volume of data will tend to heat a region of the memory more than accesses involving a lower volume of data.

Another possible detected characteristic of the accesses which may be used to estimate the temperature of the region is to detect the modes of data access to different ones of the regions. For example, modes of access which require frequent changes to the output buffers of a bank of memory may result in higher temperatures than modes of access in which a row of data is read out of a bank, stored within a buffer and then read many times from that buffer without requiring the contents of the bank to be accessed again.

Another characteristic of the memory accesses which may be used to estimate temperature of different regions is detected patterns of addresses used to access a particular region. As an example, if the addresses accessing a particular region occur in a sequential fashion then this will typically require less activity on behalf of that region of the memory and so result in a lower temperature compared with a pattern of accesses which are spaced widely apart or randomly distributed through the region concerned.

Another way of estimating the temperature of different ones of the regions is if the temperature estimating circuitry is able to detect the current supply to the different ones of the regions. The amount of current supplied to a region over a given period of time is indicative of the amount of energy dissipated within that region and accordingly the temperature of that region.

In another example embodiment, the temperature estimating circuitry may detect the rate at which the bit lines through the different regions within the memory are discharged or charged. Discharging and charging the bit lines will tend to increase the temperature of the region and accordingly a region with a lower rate of discharge and charge will have a temperature lower than a region with a higher rate of discharge and charge.

In the context of memories which are dynamic memory requiring a periodic refresh operation to retain data values (e.g. DRAM memories), then one of the memory behavioral parameters which may be used to control the mapping between memory addresses and regions indicates a maximum effective refresh period for a given region. Regions with a greater maximum effective refresh period may be refreshed less often. During a refresh operation, a region will be typically unavailable for memory accesses. Accordingly, memory regions which need to be refreshed less often will have a higher availability for memory accesses and so may be better suited for storing heavily used data. Data which is less heavily used can be stored within regions which require more frequent refresh operations as statistically such less frequent accesses are less likely to be blocked by a refresh operation. Also data that is not time-critical may also be placed in such refresh-heavy regions.

In some embodiments refresh period testing circuitry may be provided within the apparatus to perform test operations upon the dynamic memory to determine the maximum effective refresh periods of respective different ones of the plurality of regions. In other embodiments, such a determination may be made with external circuitry after the memory has been manufactured with the parameters characterizing the maximum effective refresh period being stored within the memory but the testing equipment subsequently disconnected and removed from the memory.

One way of determining the maximum effective refresh period is if the refresh period testing circuitry is configured to perform write-refresh-read tests. In such write-refresh-read tests known data values are written to the region. A given refresh period is then used to refresh the memory one or more times and the data values read back from that region. If the read back data values do not match those which were known to be written, then the refresh period was too long and exceeds the maximum effective refresh period for that region. Different refresh periods can be tested so as to establish the maximum effective refresh period using a sequence of such write-refresh-read tests.

Another type of behavioral parameter of the memory which may be used to control the mapping is one which indicates a level of access congestion for the different regions. If a particular region is subject to an existing high level of access congestion, then it may be preferable to map further memory addresses to a different region with a lower level of congestion rather than to map more memory accesses to the region which is suffering a high level of congestion. The region suffering the high level of congestion may have otherwise more desirable properties, such as a greater maximum effective refresh period, but if it is suffering a high level of access congestion, then it may be better to allocate a new memory address to another region of the memory which will not suffer from as much delay due to the access congestion.

One way of estimating a level of access congestion is to include a plurality of counters configured to count respective numbers of access operations during the given period to respective different ones of the plurality of regions. Regions with a high number of accesses in a given time will tend to be more congested than regions with a lower number of such accesses. The memory behavioral parameters may be used individually or in combination to influence the mapping applied. Different combinations of memory behavioral parameters may be used in different circumstances. These parameters may suggest different mappings and a weighting according to a predetermined formula may be used to combined the influence of the different parameters and produce a final result for the mapping to be used.

As well as the mapping between memory addresses and regions depending upon memory behavior parameters indicative of memory behavior characteristics as discussed above, the mapping is additionally also dependent upon one or more access behavior parameters indicative of access behavior characteristics associated with the access requests to be mapped. The access behavior characteristics can take a large number of different forms. The access behavioral parameters may be used individually or in combination to influence the mapping applied. Different combinations of access behavioral parameters may be used in different circumstances. These may also be subject to weighted combination.

One form of access behavioral parameter is a quality of service parameter associated with an access request. Quality of service parameters are known and may already be supported in many systems to indicate a priority level of a given access request. This quality of service information can be reused by the mapping controller to control the mapping of a memory address to a region which is more likely to match the quality of service requirements of that memory request. A quality of service level indicating a high priority may be mapped to a region of the memory having memory behavioral characteristics indicting that it will be able to respond with a low latency, whereas a memory access request with a quality of service parameter indicting a lower priority may be allocated to a region less able to respond with low latency and yet the overall operation of the system will not be detrimentally altered. Regions of the memory capable of responding with low latency may be focused upon memory access requests requiring such low latency by the variable mapping provided by the present techniques in some example embodiments.

Another form of access behavioral parameter is a frequency of occurrence of access requests within a predetermined range of memory addresses that include the memory address of that access request. Access requests with memory addresses within a region which is frequently accessed may be preferentially mapped to regions of the memory which are able to, for example, operate to service frequent memory accesses without an excessive increase in temperature, at a reduced energy cost, with a lower degree of latency etc. The factors which influence which particular access requests are mapped to which particular regions can vary considerably between different embodiments using the present techniques and the above and following examples are provided only for illustrative purposes and many further combinations and examples are possible.

Another example of an access behavioral parameter is one which represents a summed volume of data access requests within a predetermined period and within a predetermined range of memory addresses that include the memory address of the data access being mapped. Access requests to regions which must support a high volume of access requests may be preferentially allocated to regions of the memory with memory behavioral parameters matched to supporting such high volumes of data transfer. It will be appreciated that the volume of the data access is indicative of the amount of data transferred as compared to the frequency of data accesses which indicates how frequently different access requests are received. Thus, for example, a single burst access request may occur with a low frequency but specify a large volume of data to be transferred compared with a high frequency of access requests each only specifying a single word of data to be transferred. There is also a case where a specific piece of data is accessed repeatedly, but with a period between accesses that varies. Depending upon the implementation either or both of these factors may be used in controlling the mapping of memory addresses to memory regions.

Another form of access behavior parameter is one which specifies a particular source which originated the access request concerned. In a system which includes multiple sources of access requests, some of these sources may have known characteristics which are better matched to memory regions of different memory characteristics. As an example, a graphics processing unit may preferentially have its access requests mapped to regions of the memory with characteristics which support a high throughput of data and yet which need not support a low latency as a graphics processing unit is typically tolerant to high latency, but requires a high data throughput. Conversely, a general purpose processor may have as a priority for the characteristics of the memory regions it will use that such memory regions support low latency access as the program code which is often executed by general purpose processors may be intolerant to longer latency periods.

In some embodiments the maximum latency tolerance of the access requests may be explicitly specified in association with those access requests rather than being inferred from the identity of the source of the access request. Another way of inferring latency tolerance may be to include counters which monitor a number of pending accesses for a given source of access requests. A source which continues to generate access requests while having a large number of access requests already outstanding indicates that it is not stalled in making forward progress and accordingly it is relatively tolerant to long latencies and so may have its access requests mapped to memory regions which have longer latencies freeing up other regions of the memory having lower latencies for use in mapping access requests for sources which require such lower latencies.

Another example of an access behavioral parameter is a periodicity associated with an access request. Measuring circuitry may be provided which measures the periodicity of access requests arising for a given range of memory addresses. In some cases the access requests may be highly periodic, such as access requests servicing a frame buffer for a display. The access requests in this case may be characterized by a regular burst followed by a period in which no access requests arise. This information may be used in the context of a dynamic memory storing a frame buffer to match the periodicity of the access requests with the period at which refresh operations are performed upon the region of memory into which the frame buffer is mapped. If the refresh period and the access request periodicity are appropriately matched, then the refreshes of the memory region (to ensure the data is retained in the dynamic memory) can occur in the times when access requests are not being generated and accordingly may be hidden so that they do not impact the performance of the system by holding up any access requests to the frame buffer. Another option is to use the present technique to eliminate the need for refresh altogether as when, for example, a frame buffer is written, the bits that are written are refreshed. Thus, if the maximum effective refresh period is equal to or smaller than the periodicity of the frame buffer accesses, then no separate refresh operations need be performed.

As previously mentioned, the access behavioral parameters and the memory behavioral parameters may be matched using the variable mapping in a variety of different ways. In some embodiments access behavioral parameters indicative of one or both of a high access frequency or a high access volume may be mapped to regions with a tendency to suffer less heating and accordingly operate at a lower temperature despite the high access frequency or the high access volume. Regions of the memory which tend to suffer increased temperature when they are worked hard may be mapped so as to service access requests which occur less frequently or involve lower data volumes.

In a similar way, access requests with a high frequency or a high volume may be mapped preferentially to regions having a greater refresh period compared to access requests having a lower access frequency or access volume. The regions with a greater refresh period will be less likely to adversely impact performance by stalling access requests while a fresh operation is performed.

It will be appreciated that the mapping controller can take a variety of different forms. In some embodiments, the mapping controller may be provided in the form of dedicated hardware. Such dedicated hardware, may, for example, be part of the memory controller disposed between the one or more memory access request sources and the memory. Placing the mapping controller at this point allows it to monitor a variety of parameters associated with the access requests and so derive the access behavioral parameters it then uses to control the variable mapping. It can also use the characteristics of the access requests to determine or infer memory behavioral parameters which are also used to control the variable mapping applied.

In other embodiments, the mapping controller may, for example, be provided purely in the form of software, such as by a general purpose processing executing an operating system program with that operating system program including program instructions providing the mapping controller. An operating system program typically already has mechanisms which, for example, support mapping of virtual addresses to physical addresses and control memory page allocation within the system. It is thus possible for the operating system to determine for itself, or be supplied with data indicative of, both the access behavioral parameters and the memory behavioral parameters which are both used to control the variable mapping between memory addresses and regions of the memory.

In other example embodiments the mapping controller may be partially provided within the memory controller circuitry and partially provided by software included within the operating system executing on a general purpose processor. In such embodiments, the more actively used portion of the data for controlling the variable mapping may be stored in the memory controller circuitry and the less actively used portion of the data may be stored within the memory under control of the operating system which then accesses that data as and when required. In some embodiments the memory controller may be responsible for collecting information about various behaviors and passes these to the operating system, which then makes a selection of which mapping(s) are to be used.

As previously discussed the mapping controller may vary the mapping in dependence upon one or more memory behavioral parameters. In some embodiments it is appropriate to vary the mapping in dependence upon a plurality of different behavioral characteristics of the different memory regions. For example, a memory access refresh having a quality of service level indicating a high priority may be allocated to a region of the memory supporting low latency accesses unless the temperature of that region is above a predetermined threshold. Thus, both the latency provided by that region and the current temperature of that region will be used to control the mapping of an access request to that region.

In a similar way a plurality of access behavioral parameters may be used to control the mapping of an access request. As an example, an access request may indicate that it is associated with a high data volume and that it has a specific periodicity (e.g. it may be an access request associated with a frame buffer). While the high data volume might indicate it will be desirable to allocate the access request to a region of the memory with a high maximum effective refresh period (so that the accesses are not stalled during refreshes), in fact the periodicity associated with the access requests may be such that a memory region with a lower maximum effective refresh period can be used for those access requests without impacting the way in which they are serviced as the refresh periods can be hidden within the times during which access requests are not required as indicated as by the periodicity of the access requests. This may preserve memory regions with a high maximum effective refresh period for use by other access requests which require that characteristic and so boost overall system performance.

Viewed from another aspect the present invention provides apparatus for processing data comprising:

memory means for storing data and having a plurality of memory regions at a common level within a memory system;

at least one memory access request source means for generating an access request to a memory address within said memory; and mapping means for applying a variable mapping to map said memory address to one of said plurality of regions;

wherein said mapping means varies said mapping in dependence upon both:

(i) memory behavioral parameters indicative of one or more behavioral characteristics of different ones of said plurality of regions; and (ii) one or more access behavioral parameters indicative of behavioral characteristics of said access request.

Viewed from a further aspect the present invention provides a method of processing data comprising the steps of:

storing data in a memory having a plurality of memory regions at a common level within a memory system;

generating an access request to a memory address within said memory; and applying a variable mapping to map said memory address to one of said plurality of regions;

wherein said mapping is varied in dependence upon both:

(i) memory behavioral parameters indicative of one or more behavioral characteristics of different ones of said plurality of regions; and (ii) one or more access behavioral parameters indicative of behavioral characteristics of said access request.

The above, and other objects, features and advantages of this invention will be apparent from the following detailed description of illustrative embodiments which is to be read in connection with the accompanying drawings.

DESCRIPTION OF THE EMBODIMENTS

Figure 1:
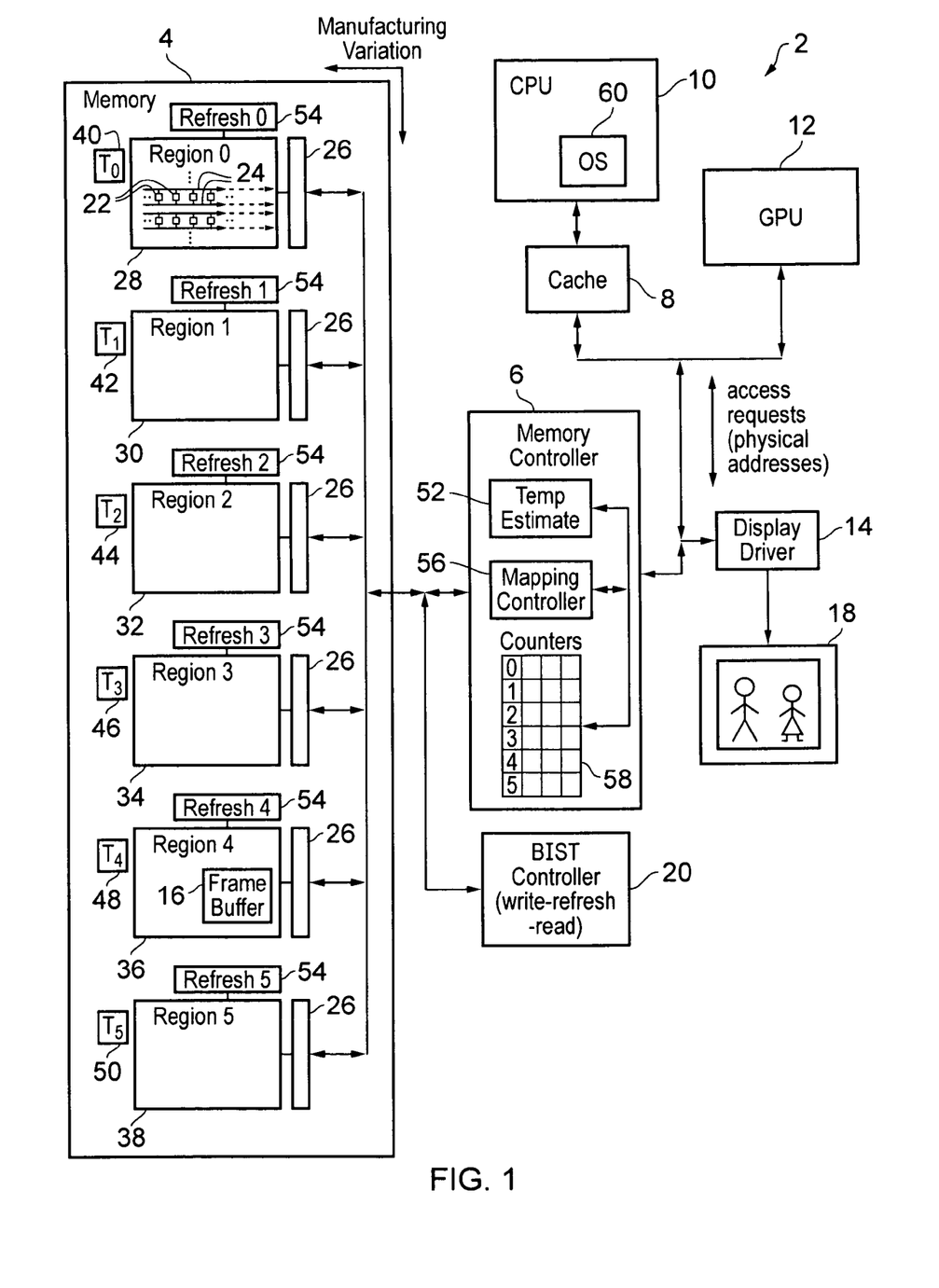
FIG. 1 schematically illustrates an apparatus for processing data including a memory with a plurality of regions at a single level, a memory controller including a mapping controller and multiple sources of access requests.

FIG. 1 schematically illustrates an apparatus for processing data 2 which incorporates a memory 4, a memory controller 6, a cache memory 8, a general purpose processor core 10 and a graphics processor core 12. The memory 4 and the cache 8 form part of the memory system. This memory system has a hierarchy in which the cache 8 is at one level and the memory 4 is at a different level. The general purpose processor core 10 and the graphics processor core 12 generate access requests to the memory 4 which specify a memory address. In the following it is assumed that the access requests from the general purpose processor core 10 are not serviced by the cache 8 but are instead serviced by the memory 4. It will be appreciated that in many instances when a cache 8 is provided, the memory accesses will be serviced out of that cache 8 rather than requiring an access to be passed to the memory 4.

A display driver 14 serves to read image defining data stored within a frame buffer 16 held in the memory 4 to generate signals for driving a display 18. The display driver 14 may in some embodiments serve as a master generating its own access requests for reading the frame buffer 16. Such access requests will typically have a periodicity corresponding to the refresh period of the display 18. Such display refresh operations will typically be long burst accesses of high volume followed by periods in which no access requests to the frame buffer 16 are made.

A refresh period testing circuit in the form of a built in self-test (BIST) controller 20 is connected to the memory 4 and performs write-refresh-read tests with different refresh periods upon different regions within the memory 4 in order to determine a maximum effective refresh period for each of the different regions. The built in self-test controller 20 will typically perform many other memory tests upon the memory 4, such as tests to determine that the arrays of bit cells 22 connected via bit lines 24 and sense amplifiers (not shown) to access buffers 26 are formed and operating correctly.

The memory 4 includes a plurality of different regions 28, 30, 32, 34, 36, 38. In this example embodiment, each of these different regions 28 to 38 has a respective associated temperature sensor 40, 42, 44, 46, 48, 50. In this example each temperature sensor 40 to 50 measures the temperature of its associated region 28 to 38. In other embodiments fewer temperature sensors may be provided. For example, the temperature sensor 42 may in some embodiments not be present and in this circumstance the temperature for region 30 may be interpolated from the temperatures measured by the neighboring temperature sensors 40, 44.

In other embodiments, it is also possible for the temperature of a region 28 to 38 to be estimated by temperature estimating circuitry 52 within the memory controller 6. Such temperature estimating circuitry 52 can determine parameters of the memory accesses being made to different ones of the regions 28 to 38 and then estimate/calculate/infer from these access requests what will be the temperature of the different regions. The temperature estimating circuitry 52 may use individual ones or combinations of the following characteristics of the access requests to make its determination, namely a detected volume of data access requests to different ones of the regions 28 to 38, detected modes of data accesses to different ones of the different regions 28 to 38 (e.g. whether they are serviced from the buffers 26 or require frequent access to the bit cell arrays 22), detected patterns of addresses used to access the different regions (e.g. sequential accesses implying efficiency and low temperature versus highly spaced or randomly spaced accesses implying lower efficiency and higher temperature). The temperature estimating circuitry 52 may also estimate the temperature based upon a detected current supplied to different ones of the regions 28 to 38 or a detection of the rate of discharge and charge of the bit lines 24 within the different regions 28 to 38.

The temperatures of the different regions 28 to 38, whether these are measured by the temperature sensors 40 to 50 or estimated by the temperature estimating circuitry 52, are one example of a memory behavior parameter which is indicative of a behavioral characteristic of the memory region 28 to 38 concerned.

The memory 4 will typically be subject to manufacturing variation between its different regions 28 to 38. Some of the regions may, for example, be more prone to suffer from high temperature operation than other of the regions. In addition, in the case of a dynamic memory, some of the regions 28 to 38 may require more frequent refresh in order to retain their data compared to other of the regions. As previously mentioned, the built in self-test controller 28 may determine the refresh periods to be used by the different regions. Refresh circuitry 54 associated with each region can apply a different refresh period to each of the different regions 28 to 38 so that an individual region is not refreshed more than is necessary. This ensures that the regions are not blocked from being available for memory accesses during refresh operations more than is necessary to retain the data within those regions and also reduces energy consumption. The temperature characteristics and the refresh characteristics may vary with manufacture and may also vary with time. The time scale within which such parameters vary may be long term as a consequence of ageing the memory 4 or may be more short term as a consequence of changes in other characteristics of the memory 4, e.g. a region which heats up may suffer higher levels of leakage at higher temperature and accordingly require a higher fresh rate. The built in self-test controller 20 may periodically test the maximum effective refresh periods throughout of the operation of the memory 4 to take account of effects such as ageing or drift.

The write-refresh-read test applied by the built in self-test controller is to write predetermined data to a region 28 to 38, refresh that region with a given period and then read back the data and compare it to the given data originally written. If the read data matches the written data, then the refresh period was effective. If the read data does not match the written data, then the refresh period was too long.

The memory controller 6 includes the mapping controller 56 which establishes the mapping to be used between memory addresses of received access requests and the regions 28 to 38 which contain those memory addresses. The mapping controller 56 is coupled to a bank of counters 58 which can determine from the access requests flowing through the memory controller 6 both access behavioral parameters and memory behavioral parameters. In the example illustrated, multiple counters are provided for each of the regions 28 to 38. The counters may be used to, for example, count the frequency with which access requests are directed to a given region, the volume of data of those access requests directed to a given region and the periodicity of access requests to a given region (e.g. the pattern of active times to inactive times). The mapping controller 56 may use the data acquired from the various forms of measurement circuitry including the temperature sensors, the built in self-test controller 20 and the counters 58 to determine memory behavioral parameters and access behavioral parameters. The access behavioral parameters may indicate a level of access congestion for respective different ones of the regions 28 to 38.

Another memory behavioral parameter may be the write time for an access request. This may be better determined by the built in self-test controller 20 which could perform tests for the different regions 28 to 38 by writing known data with different write times and then reading back the data to determine whether or not it was correctly written. In this way, a minimum necessary write time could be established that would be characteristic of a particular region 28 to 38.

The mapping controller 56 may use as a behavioral characteristic a quality of service parameter associated with the access requests issued by the general purpose processor core 10 and the graphics processor core 12. Different quality of service parameters indicate different levels of priority, e.g. how much latency tolerance a particular access request possesses. Latency tolerance may also be separately specified or determined by, for example, noting the number of pending access requests for a given source of access requests 10, 12.

Another access behavioral parameter by which latency tolerance may be separately specified or determined is, for example, noting the number of pending access requests for a given source of access requests 10, 12. A source that generates a large number of pending accesses will tend to be more latency tolerant as it is still able to generate access requests even though its earlier access requests have yet to be serviced.

Other access behavioral parameters which may be readily determined by use of the counters 58 include a frequency of occurrence of access requests within as predetermined range of memory addresses. The counters for the ranges of memory addresses may be of a finer granularity than the counters provided for the regions 28 to 38, e.g. a plurality of different memory address ranges each smaller than one of the regions 28 to 38 may be mapped into a given region.

Another form of access behavioral parameter determined by the counters for individual ranges of memory addresses may be one representing a summed volume of data access requests for that range of memory addresses.

A relatively straight forward access behavioral parameter may be the identity of the source of the access request. The source of the access request is typically included within the transaction passed to the memory controller 6 as the data needs to be returned to the source in the case of a read.

The way in which the mapping controller 56 maps the memory addresses to the regions 28 to 38 can vary depending upon the desired goal of the system as a whole. In some example embodiments, the access behavioral parameters include a frequency of occurrence of access requests within a predetermined range of memory addresses including the memory address of a given access. The mapping control preferentially maps access requests having a greater frequency of occurrence to regions of the memory having a lower temperature. In this way, the buildup of heat may be reduced. In addition, or as an alternative, the behavioral parameters may include a summed volume of data access requests within a predetermined period and within a predetermined range of memory addresses and the mapping controller will preferentially map access requests having a greater summed volume to regions of the memory having a lower temperature.

In the case of a dynamic memory having a periodic refresh period, accesses with behavioral parameters indicating a high frequency of occurrence or a high volume of data may be preferentially mapped to regions having a greater refresh period. High frequency of occurrence and high volume are indicative of high utilization and accordingly may be preferentially mapped to regions having a greater refresh period as the refresh operations will then have less impact upon these high utilization demands.

FIG. 1 illustrates the memory controller 6 including mapping controller circuitry 56. The general purpose processor core 10 may execute an operating system 60 which can also provide an alternative or an additional mapping controller. The operating system 60 will typically already control page table allocation and accordingly may be modified to support the variable mapping between memory addresses and regions of the memory 4 in dependence upon both memory behavioral characteristics and access behavioral characteristics as discussed above. When the operating system 60 and the mapping controller 56 are sharing responsibility for the variable mapping, frequently used data for controlling the mapping may be stored in the memory controller 6 to be readily accessed by the mapping controller 56 whereas less frequency required data characterizing the access behavioral parameters and the memory behavioral parameters may be stored under operating system 60 control within the memory 4.

It is possible that the mapping applied by the memory controller 56 may depend upon a single access behavior parameter in combination with a single memory behavioral parameter. However, in other embodiments the mapping may be controlled in dependence upon multiple memory behavioral parameters and/or multiple access behavioral parameters. As an example, if the detected temperature of a region rises above a threshold level, then this might override the allocation of memory addresses in to that region that would otherwise occur. Similarly, the identity of a particular source of access requests constituting an access behavior parameter may override the other access behavioral parameters which would dictate a different region to be allocated for access requests from such a source. Combinations of behavioral parameters may be combined in a weighted manner in accordance with a predetermined formula to determine the final mapping to be used.

Once the mappings are in place, in some embodiments they may be updated in dependence upon updated memory behavioral parameters and/or updated access behavioral parameters. Such mapping updates may occur periodically (e.g. in response to a watchdog timer) or may be triggered by certain events (e.g. the temperature of a particular region exceeding a threshold temperature). In these cases, it may be that as the processing workload or other environmental conditions have varied and the mapping originally selected by the mapping controller 56 is no longer appropriate such that a different mapping should be adopted. In this case, when data is to be moved between different ones of the regions 28 to 38, then it will be copied from the old region to the new region and then the mapping to be applied will be updated.

Figure 2:
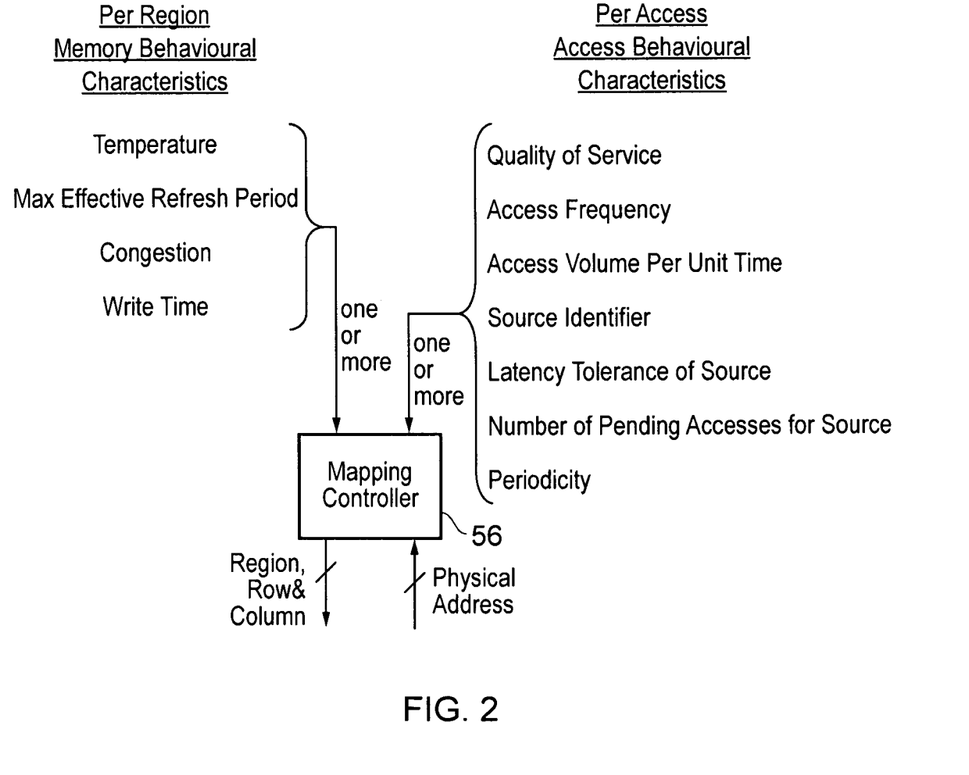
FIG. 2 schematically illustrates different types of memory behavioral characteristics and access behavioral characteristics which may be used by the mapping controller to control the mapping applied between memory addresses associated with access requests and the regions of the memory into which those access requests are mapped.

FIG. 2 schematically illustrates how the mapping controller 56 receives a physical address and maps this to a particular region 28 to 38 and optionally a particular row and column (this may in fact be done within the region) of the memory 4. This mapping is performed in dependence upon one or more per region memory behavioral characteristics and one or more per access access behavioral characteristics. The mapping is dependent upon both at least one per region memory behavioral characteristic and at least one per access access behavioral characteristic.

The per region memory behavioral characteristics may include temperature, maximum effective refresh period, congestion and write time each associated with a different one of the regions 28 to 38. The per access access behavioral characteristics may include a quality of service, an access frequency, an access volume, a source identifier, a latency tolerance, a number of pending accesses and a periodicity. It will be appreciated that the above examples of memory behavioral characteristics and access behavioral characteristics are only illustrative and other characteristics may also be employed to control the mapping applied either in addition to the above or as an alternative to the above.

Figure 3:
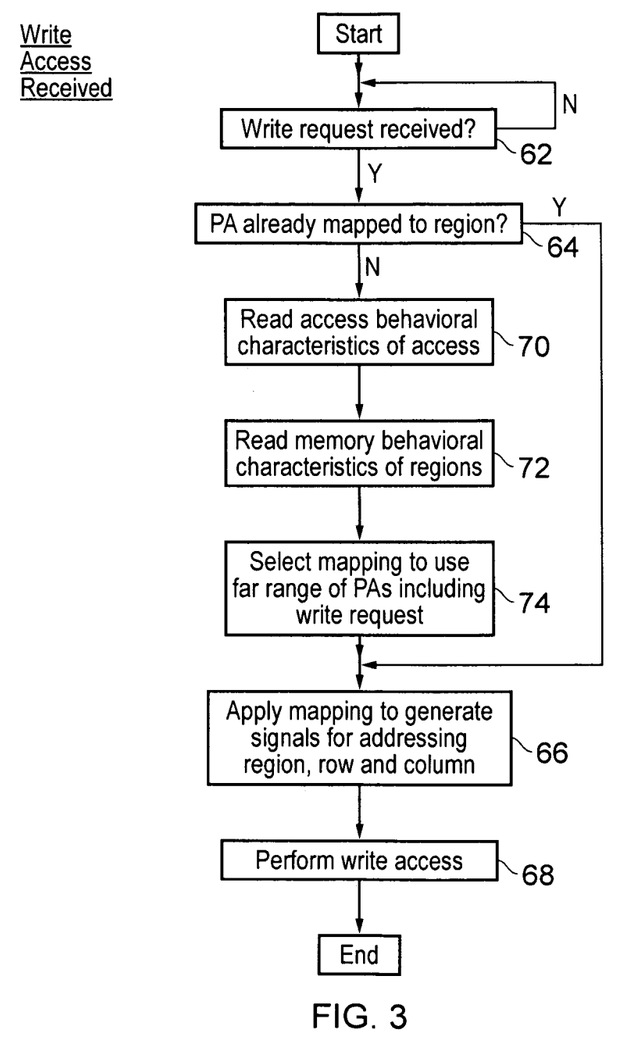
FIG. 3 is a flow diagram schematically illustrating processing performed upon receipt of a write access.

FIG. 3 is a flow diagram schematically illustrating processing performed when an access request is received. At step 62 processing waits until a write request is received. Step 64 determines whether or not the physical address for that received write request has already been mapped to one of the regions 28 to 38. If the physical address has already been mapped, then processing proceeds to step 66 where the mapping is applied and step 68 where the write access is performed.

If the determination at step 64 is that the physical address has not already been mapped, then step 70 serves to read the access behavioral characteristics for the write access received. Step 72 reads the memory behavioral characteristics of the various regions 28 to 38 available for the mapping. Step 74 selects a mapping to be employed which matches the access behavioral characteristics to the memory behavioral characteristics in one of the manners previously discussed. The selection of mapping may not be necessarily to maximize the performance of the write request received at step 62, but may instead be made with the aim of improving the overall utilization of the memory 4 and the efficiency of the apparatus for processing data 2 as a whole.

Figure 4:
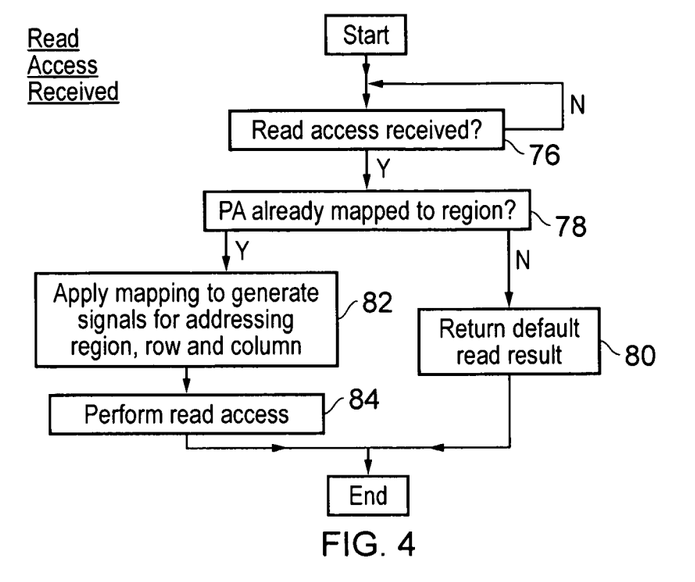
FIG. 4 is a flow diagram schematically illustrating processing performed upon receipt of a read access.

FIG. 4 is a flow diagram schematically illustrating the processing performed when a read access is received. At step 76 processing waits until a read access is received. Step 78 determines whether or not the physical address of that read access is already mapped. If the physical address has not been mapped, then step 80 returns a default read result as no data will have been written to the memory 4 corresponding to that read access as there is no existing mapping and accordingly there is no point in actually performing any access to the memory 4. It is possible to read a piece of memory before it is written, but the data returned will be indeterminate—this could be done if desired.

If the determination at step 78 is that the physical address is mapped, then step 82 applies the existing mapping and step 84 performs the read to the region 28 to 38 which is identified in the mapping applied at step 82.

Figure 5:
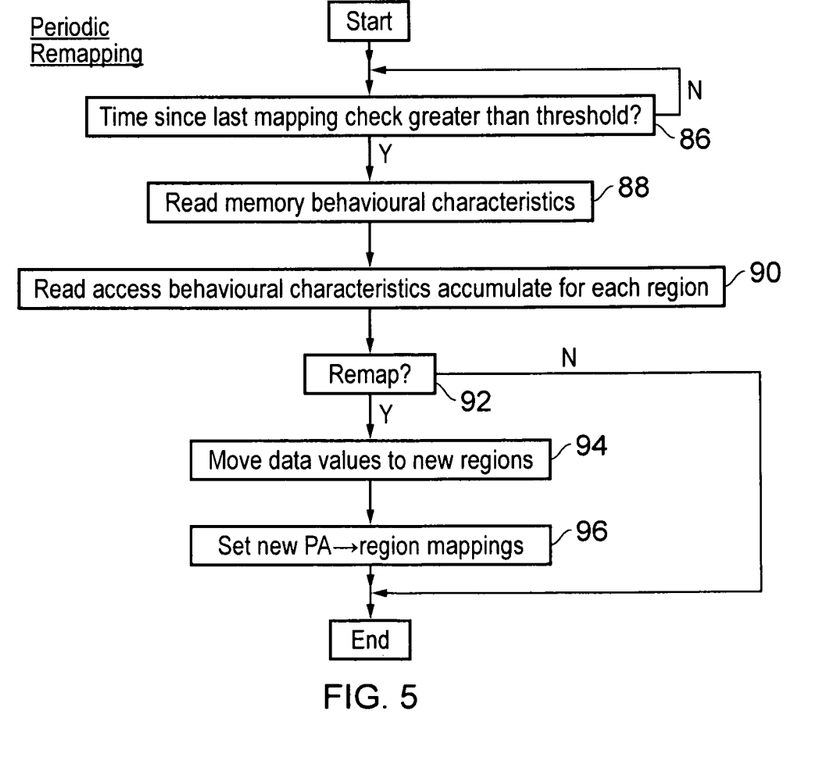
FIG. 5 is a flow diagram schematically illustrating the periodic remapping of memory addresses to regions.

FIG. 5 is a flow diagram schematically illustrating processing performed as part of a periodic updating/remapping of the mappings applied. Step 86 waits until a time since the last mapping check is greater than a threshold value. This may be determined by, for example, a watchdog timer. In other embodiments step 86 may be replaced by a step which waits until a predetermined trigger event is detected, such as the temperature of one of the regions 28 to 38 exceeding a threshold temperature.

Following step 86, processing proceeds to step 88 where the current memory behavioral characteristics are read. Step 90 reads the access behavioral characteristics that have been accumulated for each of the regions within the counters 58 of the memory controller 6. Step 92 then determines whether or not a remap is necessary in dependence upon the read memory behavioral characteristics and the read access behavioral characteristics from steps 88 and 90. A remapping may be necessary, for example, if a region which was initially associated with a high access frequency has over time become a region in which the access requests occur at a low frequency. A remapping may be appropriate in this circumstance to map a different range of memory addresses in to that region as that different range of memory addresses may be better able to take advantages of the capability of that region in servicing high frequency access requests. Another example may be that a region which was previously operating with a low temperature is found to be operating with a high temperature and accordingly it is desirable to map ranges of memory addresses previously mapped to that region into different regions so as to reduce the workload for that region and accordingly reduce its temperature.

If the determination at step 92 is that a remapping is not necessary, then the processing ends. If the determination at step 92 is that a remapping is desirable, such as for the reasons described above, then step 94 serves to move the data values to be remapped into their new regions and then step 96 serves to activate the new mappings between physical address and regions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Apparatus for processing data comprising:
a memory having a plurality of regions at a common level within a memory system;
at least one memory access request source configured to generate an access request to a memory address within said memory; and
a mapping controller configured to apply a variable mapping to map said memory address to one of said plurality of regions;
wherein said mapping controller varies said mapping in dependence upon both:
(i) one or more memory behavioral parameters indicative of one or more behavioral characteristics of different ones of said plurality of regions; and
(ii) one or more access behavioral parameters indicative of behavioral characteristics of said access request; and
wherein said memory is a dynamic memory requiring a periodic refresh operation to retain data values and said one or more memory behavioral parameters indicate maximum effective refresh periods of respective different ones of said plurality of regions.

2. Apparatus as claimed in claim 1, wherein at least one of said one or more behavioral characteristics of different ones of said plurality of regions is a dynamic behavioral characteristic that changes with time.

3. Apparatus as claimed in claim 1, wherein at least one of said one or more behavioral characteristics of different ones of said plurality of regions varies between said different ones of said plurality of regions in dependence upon manufacturing variability of said memory.

4. Apparatus as claimed in claim 1, comprising measurement circuitry configured to measure at least one of said one or more behavioral characteristics of different ones of said plurality of regions.

5. Apparatus as claimed in claim 1, wherein at least one of said one or more memory behavioral parameters indicates temperatures of respective different ones of said plurality of regions.

6. Apparatus as claimed in claim 5, wherein said memory includes a plurality of temperature sensors configured to measure temperature of different ones of said plurality of regions.

7. Apparatus as claimed in claim 5, wherein said memory includes a plurality of temperature sensors configured to measure temperature at different points within said memory and temperature of one or more of said plurality of regions is estimated by interpolating between at least some of said temperatures measured at said different points.

8. Apparatus as claimed in claim 5, comprising temperature estimating circuitry configured to estimate temperature of different ones of said plurality of regions in response to a detected volume of data accesses to said different ones of said plurality of regions.

9. Apparatus as claimed in claim 5, comprising temperature estimating circuitry configured to estimate temperature of different ones of said plurality of regions in response to detected modes of data accesses to said different ones of said plurality of regions.

10. Apparatus as claimed in claim 5, comprising temperature estimating circuitry configured to estimate temperature of different ones of said plurality of regions in response to detected patterns of addresses used to access said different ones of said plurality of regions.

11. Apparatus as claimed in claim 5, comprising temperature estimating circuitry configured to estimate temperature of different ones of said plurality of regions in response to a detected current supplied to said different ones of said plurality of regions.

12. Apparatus as claimed in claim 5, wherein said plurality of regions are accessed via bit lines extending through said plurality of regions and comprising temperature estimating circuitry configured to estimate temperature of different ones of said plurality of regions in response to a detected rate at which said bit lines through said different ones of said plurality of regions are discharged and charged.

13. Apparatus as claimed in 5, wherein said one or more access behavioral parameters include a frequency of occurrence of access requests within a predetermined range of memory addresses including said memory address and said mapping controller preferentially maps access requests having a greater frequency of occurrence to regions of said memory having a lower temperature.

14. Apparatus as claimed in 5, wherein said one or more access behavioral parameters include a summed volume of data of access requests within a predetermined period and within a predetermined range of memory addresses including said memory address and said mapping controller preferentially maps access requests having a greater summed volume to regions of said memory having a lower temperature.

15. Apparatus as claimed in claim 1, comprising refresh period testing circuitry configured to perform test operations upon said dynamic memory to determine said maximum effective refresh periods of respective different ones of said plurality of regions.

16. Apparatus as claim in claim 15, wherein said refresh period testing circuitry is configured to perform write-refresh-read tests with different refresh periods for each of said plurality of regions to determine a maximum effective refresh period for each of said plurality of regions.

17. Apparatus as claimed in claim 1, wherein said one or more memory behavioral parameters indicate a level of access congestion of respective different ones of said plurality of regions.

18. Apparatus as claimed in claim 17, comprising a plurality of counters configured to count respective numbers of access operations during a given period to respective different ones of said plurality of regions.

19. Apparatus as claimed in claim 1, wherein said one or more memory behavioral parameters indicate a write time for an access request to different ones of said plurality of regions.

20. Apparatus as claimed in claim 1, wherein said one or more access behavioral parameters include a quality of service parameter associated with said access request.

21. Apparatus as claimed in claim 1, wherein said one or more access behavioral parameters include a frequency of occurrence of access requests within a predetermined range of memory addresses including said memory address.

22. Apparatus as claimed in claim 1, wherein said one or more access behavioral parameters include a summed volume of data of access requests within a predetermined period and within a predetermined range of memory addresses including said memory address.

23. Apparatus as claimed in claim 1, comprising a plurality of memory access request sources and said one or more access behavioral parameters include a parameter identifying which of said plurality of memory access request sources generated said access request.

24. Apparatus as claimed in claim 23, wherein said plurality of memory access request sources include a general purpose processor core and a graphics processor core.

25. Apparatus as claimed in claim 1, wherein said one or more access behavioral parameters include a latency tolerance parameter specifying a target maximum latency for completing said access request.

26. Apparatus as claimed in claim 1, wherein said one or more access behavioral parameters include a pending accesses parameter specifying a number of pending accesses from said at least one memory access request source.

27. Apparatus as claimed in claim 1, wherein said one or more access behavioral parameters include a periodicity associated with said access request.

28. Apparatus as claimed in claim 27, wherein said access request is to a frame buffer within said memory and said mapping controller maps said frame buffer to one or more of said plurality of regions wherein a refresh period is matched to said periodicity such that delays of access requests due to said periodic refresh operations are reduced or eliminated.

29. Apparatus as claimed in claim 1, wherein said one or more access behavioral parameters include a frequency of occurrence of access requests within a predetermined range of memory addresses including said memory address and said mapping controller preferentially maps access requests having a greater frequency of occurrence to regions of said memory having a greater refresh period.

30. Apparatus as claimed in claim 1, wherein said one or more access behavioral parameters include a summed volume of data of access requests within a predetermined period and within a predetermined range of memory addresses including said memory address and said mapping controller preferentially maps access request having a greater summed volume to regions of said memory having a greater refresh period.

31. Apparatus as claimed in claim 1, wherein said mapping controller is part of memory controller circuitry disposed between said at least one memory access request source and said memory.

32. Apparatus as claimed in claim 1, wherein said mapping controller is provided by a general purpose processor executing an operating system program.

33. Apparatus as claimed in claim 1, wherein said mapping controller comprises
   part of memory controller circuitry disposed between said at least one memory access request source and said memory; and
   a general purpose processor executing an operating system program, wherein
   a more actively used portion of data for controlling said variable mapping is stored in said memory controller circuitry and a less actively use portion of said data for controlling said variable mapping is stored under control of said operating system in said memory.

34. Apparatus as claimed in claim 1, wherein said mapping controller comprises
   part of memory controller circuitry disposed between said at least one memory access request source and said memory; and
   a general purpose processor executing an operating system program, wherein
   said memory controller circuitry collects said one or more memory behavioral parameters and said access behavioral parameters and supplies both to said operating system program that determines said variable mapping to be used.

35. Apparatus as claimed in claim 1, wherein said mapping controller varies said mapping in dependence upon memory behavioral parameters indicative of a plurality of different behavioral characteristics of different ones of said plurality of regions.

36. Apparatus as claimed in claim 1, wherein said mapping controller varies said mapping in dependence upon a plurality of different access behavioral parameters indicative of behavioral characteristics of said access request.

37. Apparatus as claimed in claim 1, wherein said mapping controller is configured to periodically update said mapping in dependence upon updated said one or more memory behavioral parameters and updated said one or more access behavioral parameters.

38. Apparatus as claimed in claim 1, wherein said mapping controller is configured to respond to a detected trigger event by updating said mapping in dependence upon updated said one or more memory behavioral parameters and updated said one or more access behavioral parameters.

39. Apparatus for processing data comprising:
means for storing data and having a plurality of memory regions at a common level within a memory system;
at least one memory access request source means for generating an access request to a memory address within said means for storing; and
mapping means for applying a variable mapping to map said memory address to one of said plurality of regions;
wherein said mapping means varies said mapping in dependence upon both:
(i) memory behavioral parameters indicative of one or more behavioral characteristics of different ones of said plurality of regions; and
(ii) one or more access behavioral parameters indicative of behavioral characteristics of said access request; and
wherein said means for storing is a dynamic memory requiring a periodic refresh operation to retain data values and said memory behavioral parameters indicate maximum effective refresh periods of respective different ones of said plurality of regions.

40. A method of processing data comprising the steps of:
storing data in a memory having a plurality of memory regions at a common level within a memory system;
generating an access request to a memory address within said memory; and
applying a variable mapping to map said memory address to one of said plurality of regions;
wherein said mapping is varied in dependence upon both:
(i) memory behavioral parameters indicative of one or more behavioral characteristics of different ones of said plurality of regions; and
(ii) one or more access behavioral parameters indicative of behavioral characteristics of said access request;
wherein said memory is a dynamic memory requiring a periodic refresh operation to retain data values and said memory behavioral parameters indicate maximum effective refresh periods of respective different ones of said plurality of regions.

\* \* \* \* \*